(12) United States Patent
Maldonado et al.

(10) Patent No.: US 9,048,188 B2
(45) Date of Patent: Jun. 2, 2015

(54) SEMICONDUCTOR THAT HAS A FUNCTIONALIZED SURFACE

(75) Inventors: Stephen Maldonado, Ann Arbor, MI (US); Jhindan Mukherjee, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 142 days.

(21) Appl. No.: 13/578,470

(22) PCT Filed: Feb. 16, 2011

(86) PCT No.: PCT/US2011/025079
§ 371 (c)(1),
(2), (4) Date: Oct. 19, 2012

(87) PCT Pub. No.: WO2011/103187
PCT Pub. Date: Aug. 25, 2011

(65) Prior Publication Data
US 2013/0035498 A1  Feb. 7, 2013

Related U.S. Application Data

(60) Provisional application No. 61/305,072, filed on Feb. 16, 2010.

(51) Int. Cl.
*C23C 18/00* (2006.01)
*C23C 20/00* (2006.01)
(Continued)

(52) U.S. Cl.
CPC .............. *H01L 21/306* (2013.01); *C23C 22/05* (2013.01); *C23C 18/18* (2013.01); *C23C 22/17* (2013.01);
(Continued)

(58) Field of Classification Search
CPC .............. H01L 21/02236; H01L 21/02241; H01L 21/3245; H01L 21/02395
See application file for complete search history.

(56) References Cited

U.S. PATENT DOCUMENTS 5,599,748 A * 2/1997 Holloway et al. ............. 438/767
6,830,950 B2  12/2004 Chinn et al.
(Continued)

FOREIGN PATENT DOCUMENTS

WO    2011103187 A2   12/2011

OTHER PUBLICATIONS

International Search Report and Written Opinion for PCT Application No. PCT/US2011/025079 filed Feb. 16, 2011; mailed Nov. 1, 2011; 11 pages.

*Primary Examiner* — Duy Deo
(74) *Attorney, Agent, or Firm* — Howard & Howard Attorneys PLLC

(57) ABSTRACT

This invention provides a semiconductor having a functionalized surface that is resistant to oxidation and that includes a plurality of atoms of a Group III element bonded to organic groups. The functionalized surface has less than or equal to about 1 atom of the Group III element bonded to an oxygen atom per every 1,000 atoms of the Group III element bonded to the organic groups, as determined using X-ray photoelectron spectroscopy. This invention also provides a method of functionalizing the surface and includes the step of halogenating at least one of the plurality of atoms of the Group III element to form halogenated Group III element atoms. The method also includes the step of reacting at least one of the halogenated Group III element atoms with a Grignard reagent to form a bond between the at least one Group III element atom and the organic groups.

22 Claims, 13 Drawing Sheets

(51) Int. Cl.
*C23C 24/00* (2006.01)
*H01L 21/306* (2006.01)
*C23C 22/05* (2006.01)
*C23C 18/18* (2006.01)
*C30B 29/40* (2006.01)
*C30B 33/00* (2006.01)
*C23C 22/17* (2006.01)
*C23C 18/20* (2006.01)
*C23C 22/14* (2006.01)
*H01L 21/02* (2006.01)

(52) U.S. Cl.
CPC ............. *C23C 18/2046* (2013.01); *C23C 22/14* (2013.01); *C30B 29/406* (2013.01); *C30B 33/00* (2013.01); *H01L 21/02538* (2013.01); *H01L 21/02664* (2013.01)

(56) References Cited

U.S. PATENT DOCUMENTS

| | | | |
|---|---|---|---|
| 8,242,003 B1* | 8/2012 | Han et al. ...................... | 438/493 |
| 2005/0217559 A1* | 10/2005 | Bocian et al. ..................... | 117/5 |
| 2007/0212897 A1 | 9/2007 | Bocian et al. | |
| 2009/0121210 A1 | 5/2009 | Bocian et al. | |
| 2010/0044678 A1* | 2/2010 | Afzali-Ardakani et al. .... | 257/24 |

* cited by examiner $\theta_c = 19.9 \pm 0.9°$ $\theta_c = 67 \pm 4°$ $\theta_c = 119 \pm 6°$ $\theta_c = 45 \pm 4°$ $\theta_c = 85 \pm 5°$ $\theta_c = 99 \pm 4°$ $\theta_c = 107 \pm 11°$ □ GaP(111)A, etched
■ GaP(111)A, PCl₅/C₁₈H₃₇MgCl
▽ GaAs(111)A, etched
▼ GaAs(111)A, HCl/ C₁₈H₃₇MgCl

SEMICONDUCTOR THAT HAS A FUNCTIONALIZED SURFACE

CROSS-REFERENCE TO RELATED APPLICATIONS

The subject patent application is the National Stage of International Patent Application No. PCT/US2011/025079, filed on Feb. 16, 2011, which claims priority to and all the benefits of U.S. Provisional Patent Application Ser. No. 61/305,072, which was filed on Feb. 16, 2010, the entire specifications of which are expressly incorporated herein by reference.

FIELD OF THE INVENTION

The present invention generally relates to a semiconductor that has a functionalized surface and a method of functionalizing the semiconductor. More specifically, the functionalized surface is resistant to oxidation and includes a plurality of atoms of a Group III element that are bonded to organic groups.

DESCRIPTION OF THE RELATED ART

Typical semiconductors (i.e., compounds that are traditionally classified as semiconductors) have electrical conductivities that fall between those of conductors and insulators. Semiconductors may be used in transistors, solar cells, diodes (such as light-emitting diodes), rectifiers, digital and analog integrated circuits, radios, computers, telephones, and many other electronic devices.

Semiconductors typically carry current either by a flow of electrons or by a flow of positively-charged "holes." The electrons of semiconductors have energies within certain energy bands between ground state and a free electron energy level, which is a level of energy required for an electron to escape from the semiconductor and flow. Each of the energy bands corresponds to a discrete quantum state up to and including a valence band and a conduction band of the semiconductor. Semiconductors typically have enough electrons to nearly fill the valence band thus allowing these electrons to be easily excited from the valence band into the conduction band and allowing the electrons to flow, thereby generating current. The ease with which the electrons can be excited from the valence band to the conduction band depends on a band gap between the energy bands.

Semiconductors tend to be susceptible to interfacial degradation and oxidation, which affects their performance. The degradation and oxidation typically affects how much energy is required to excite electrons from the valence band into the conduction band. In addition, any degradation and oxidation that occurs tends to reduce the predictability and stability of the semiconductor such that many of skill in the art cannot precisely understand and predict how the semiconductors will act under a variety of conditions.

In the past, protective native/thermal oxides were investigated for passivating, i.e., reducing the reactivity of, semiconductors for purposes of inhibiting degradation and oxidation thereof. However, there are few available chemical routes for such processes thus rendering this technology unsuitable for commercial use. Passivation of semiconductors with thiols and sulfides has also previously been explored. However, neither the thiols nor the sulfides are particularly stable and their modes of attachment to the semiconductors are not well understood, thereby limiting practical utility and reproducibility. More specifically, photochemical grafting of alkenes onto Group III-V semiconductors has also been reported but typically involves initial pretreatment of the semiconductors with inductively coupled hydrogen plasma which is both expensive and time consuming. Perhaps more importantly, photochemical (ultraviolet light) grafting of alkenes onto Group III-V semiconductors still results in appreciable interfacial oxidation which, as described above, reduces the predictable operation and stability of the semiconductor. In addition, the use of the plasma and UV light stimulates many different chemistries on the surface of the semiconductors thereby degrading the surface and making the semiconductor less suitable for use. Accordingly, there remains an opportunity to develop an improved semiconductor.

SUMMARY OF THE INVENTION AND ADVANTAGES

The instant invention provides a semiconductor that has a functionalized surface that is resistant to oxidation. The functionalized surface includes a plurality of atoms of a Group III element bonded to organic groups. The functionalized surface also has less than or equal to about 1 atom of the Group III element bonded to an oxygen atom per every 1,000 atoms of the Group III element bonded to the organic groups, as determined using X-ray photoelectron spectroscopy (XPS). The invention also provides a method of functionalizing the surface of the semiconductor to resist oxidation. The method includes the step of halogenating at least one of the plurality of atoms of the Group III element to form halogenated Group III element atoms. The method also includes the step of reacting at least one of the halogenated Group III element atoms with a Grignard reagent to form a bond between the at least one Group III element atom and the organic groups. The step of reacting, and the formation of the bonds between the at least one Group III element and the organic groups, functionalizes the surface of the semiconductor to resist oxidation. This invention also provides an article that includes the semiconductor that has the functionalized surface.

The organic groups bonded to the plurality of atoms of the Group III element functionalize and passivate the surface of the semiconductor simultaneously and allow the surface to resist oxidation, as represented by the small number of oxygen atoms bonded to the atoms of the Group III element. The organic groups tend to cause steric blocking effects that result in a kinetic inhibition of, and resistance to, oxide formation (i.e., oxidation). The organic groups also tend to decrease the negative effects of defects that may be present on the surface of the semiconductor and allow for effective control of electronic properties of the semiconductor.

The step of halogenating activates the atoms of the Group III element and tends to make a carbon-Group III element bond forming reaction more favored thermodynamically and/or kinetically. In other words, the step of halogenating tends to allow the halogenated atoms to be receptive to forming a bond with the aforementioned organic groups. The step of reacting with the Grignard reagent promotes specific and efficient bond forming reactions with the organic groups that are both cost and time effective. In addition, reacting with the Grignard reagent is reproducible and controllable, thereby maximizing industrial and commercial viability and overall desirability.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1A:
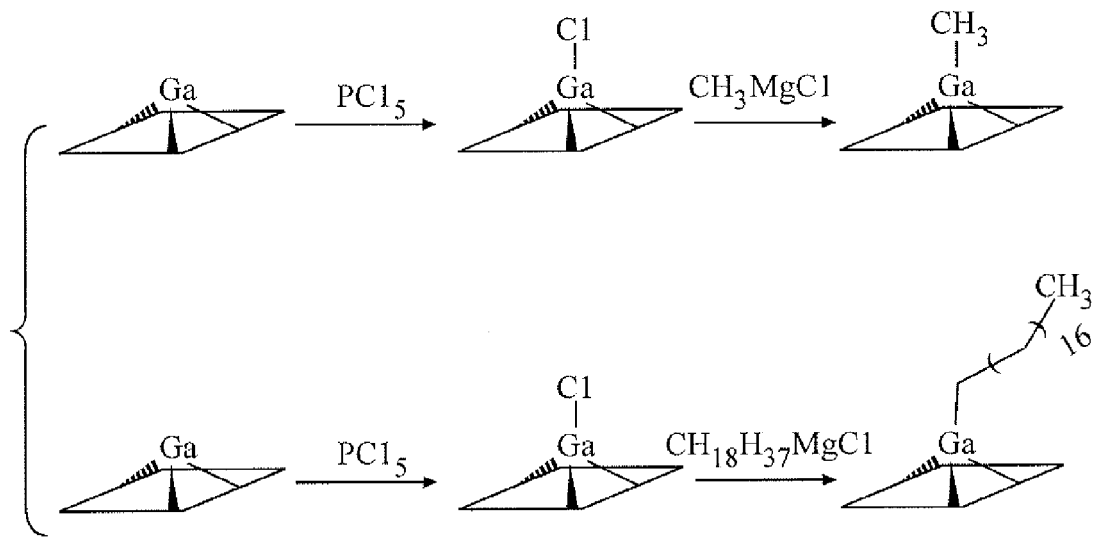
FIG. 1A illustrates two non-limiting reaction schemes wherein gallium atoms are alkylated after halogenation and subsequent reaction with two different Grignard reagents.

The instant invention provides a semiconductor that has a surface (20) that is functionalized (i.e., a functionalized surface) and that is resistant to oxidation, as shown, for example, in FIGS. 1A and B. The invention also provides a method of functionalizing the surface (20) and an article that includes the semiconductor having the functionalized surface.

Figure 1B:
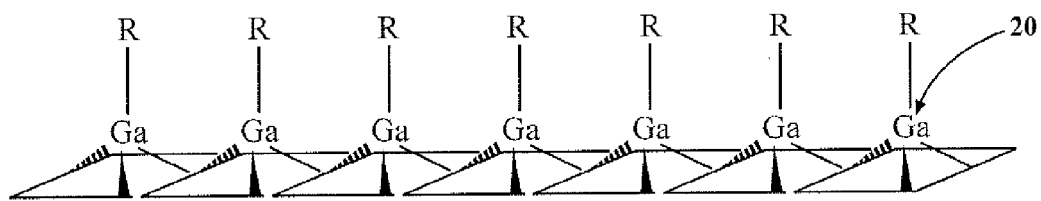
FIG. 1B illustrates one example of the functionalized surfaced of the semiconductor wherein gallium atoms are bonded to organic groups (R)

Surface of the Semiconductor:

Both before and after functionalization, the surface (20) may be smooth or may include undulations or defects. Alternatively, the surface (20) may include portions that are smooth and other portions that include undulations or defects. Most typically, the surface (20) is further defined as a top or uppermost plane extending across the atoms that form the semiconductor. As shown in FIG. 1B, for example, the surface (20) is typically the top or uppermost plane that extends across the gallium atoms. Most typically, the surface (20) itself is disposed below or under organic groups that are used to functionalize the surface (20), such as "R" groups set forth in FIG. 1B. It is contemplated that the organic groups used to functionalize the surface (20) of the semiconductor may themselves form a second outermost surface (20) that is disposed above the surface (20) of the semiconductor and that is exposed to the environment.

The surface (20) of the semiconductor includes a plurality of atoms of a Group III element, e.g. boron, aluminum, gallium, indium, or thallium. In one embodiment, the surface (20) includes an approximate mono-layer of atoms of the Group III element. However, the surface (20) may include two or more layer of atoms of the Group III element. Typically, the Group III element is further defined as gallium, indium, or aluminum. The plurality of atoms may include only atoms of a single Group III element or may include a combination of atoms of two or more Group III elements. Atoms of a Group IV and/or Group V element may be combined with the atoms of the single Group III element or with the combination of atoms from the two or more Group III elements. In various embodiments, the surface (20) consists essentially of a plurality of atoms of gallium, indium, and/or aluminum and includes less than 0.01 weight or molar percent of atoms of Group IV and/or Group V elements. Alternatively, the surface (20) may consist essentially of the plurality of atoms of a single Group III element and include less than 0.01 weight or molar percent of atoms of other Group III elements and/or of atoms of Group IV and/or Group V elements. As just one non-limiting example, the surface (20) may consist essentially of a plurality of gallium atoms and include less than 0.01 weight or molar percent of atoms of other Group III elements. It is also contemplated that the surface (20) may consist of a plurality of atoms of a single Group III element or consist of a plurality of atoms of a combination of two or more Group III elements. In some embodiments, the surface (20) includes less than 10 weight percent, 5 weight percent, 1 weight percent, 0.5 weight percent, 0.1 weight percent, or less than 0.01 weight percent, of silicon, germanium, and/or tin. It is also contemplated that the surface (20) may be free of silicon, germanium, and/or tin.

At least some of the atoms of the Group III element may be covalently bonded to a Group V element to form, for example, aluminum nitride, aluminum phosphide, aluminum arsenide, gallium nitride, gallium phosphide, gallium arsenide, indium nitride, indium phosphide, and/or indium arsenide. It is also contemplated that one or more aluminum/gallium/indium—phosphide-arsenide alloys, aluminum/indium phosphide-arsenide alloys, aluminum/indium phosphide-nitride alloys, aluminum/indium arsenide-nitride alloys, gallium/indium phosphide-arsenide alloys, gallium/indium phosphide-nitride alloys, gallium/indium arsenide-nitride alloys, gallium phosphide-arsenide alloys, indium phosphide-arsenide alloys, and combinations thereof, may be utilized. Of course, even if some atoms of the Group III element are bonded to a Group V element, not every atom need be bonded in such a way. Just as above, the surface (20) may include only atoms of a single Group III element bonded to atoms of a single Group V element, atoms of a single Group III element bonded to atoms of more than one Group V element, atoms of more than one Group III element bonded to atoms of a single Group V element, or atoms of more than one Group III element bonded to atoms of more than one Group V element. It is also contemplated that the aforementioned description of the "consisting essentially of" and "consisting of" embodiments may, but not necessarily, include the atoms of the Group III element(s) bonded to atoms of the Group V element(s).

Body of the Semiconductor:

In addition to the surface (20) described above, the semiconductor typically has a body (not shown in the Figures) that includes one or more layers of atoms disposed below or under the surface (20). The body of the semiconductor typically includes atoms of the Group III element and may have any composition or configuration as described above relative to the surface (20). Most typically, the atoms of the body of the semiconductor are not functionalized with the organic groups. In various embodiments, the semiconductor including the body and the surface (20) includes at least 10, 20, 30, 40, 50, 60, 70, 80, 90, 95, 99, or even greater, parts by weight of atoms of the Group III element per 100 parts by weight of the semiconductor. In other embodiments, the semiconductor including the body and the surface (20) includes at least 55, 65, 75, 85, or 95 parts by weight of atoms of the Group III element based on 100 parts by weight of the semiconductor. Most typically, the body of the semiconductor includes the atoms of the Group III element bonded to the Group V element. As just one non-limiting example, the body of the semiconductor may include, or be, gallium phosphate. Of course, it is to be understood that this invention is not limited to the aforementioned values and that the semiconductor can include an amount of the plurality of atoms of the Group III element and/or Group V element in any whole or fractional amount or range of amounts within the aforementioned values.

Structure of the Body and/or Surface of the Semiconductor:

The semiconductor body and/or surface (20) may have any orientation or structure known in the art. In one embodiment, at least some of the atoms of the Group III element are covalently bonded to phosphorous to form, for example, GaP, which is tetrahedral. In another embodiment, at least some of the atoms of the Group III element are bonded such that they have a zinc-blend structure. In still other embodiments, at least some of the atoms of the Group III element are bonded such that they form a wurtzite structure. Typically GaP and GaAs form zinc-blend structures. GaN, on the other hand, typically forms a wurtzite structure.

The semiconductor body can be cut along one or more crystalline planes/faces, such as a 111 plane/face, a 0001 plane/face, etc, to expose, for example, a majority of atoms of Group III and/or Group V elements on/along the plane/face. As is known in the art, after cutting along the one or more crystalline planes, the semiconductor body may have an "A" side that includes predominately exposed Group III atoms (e.g. GaP(111)A) and a "B" side that includes predominately exposed Group V atoms (e.g. GaP(111)B). The aforementioned nomenclature may also describe the aluminum/gallium/indium-nitrides/phosphides/arsenides, set forth above. At least a portion, or an entirety, of the surface (20) of the semiconductor may also be further defined as one of the aforementioned planes/faces such as a 111 face.

Functionalized Surface of the Semiconductor:

Referring back to the surface (20) of the semiconductor, the surface (20) is functionalized and, when functionalized, includes the plurality of atoms of the Group III element bonded to the organic groups, as first introduced above. Said differently, the organic groups functionalize the surface (20) (and atoms thereof) upon bonding. Typically, the organic groups are covalently bonded to the atoms of the Group III element. In one embodiment, the organic groups are covalently bonded to the plurality of atoms of the Group III element via reaction with a Grignard reagent, as described in greater detail below.

The organic groups are not particularly limited in composition or structure and one or more organic groups may independently be further defined, for example, as a substituted or unsubstituted alkyl, aryl, alkenyl, alkynyl, aliphatic, cycloaliphatic, or aromatic, group. Alternatively, one or more organic groups may independently be further defined as a functionalized alkyl or aryl group that is bonded to, for example, a halogen atom. It is to be appreciated that in this embodiment, the halogen atom is not bonded to the Group III element. In various embodiments, at least one organic group is a substituted or unsubstituted alkyl or aryl group having from 1 to 50, 1 to 40, 1 to 30, 1 to 20, 5 to 20, 5 to 15, 5 to 10, 10 to 30, 10 to 20, 15 to 30, 15 to 20, 3 to 18, 5 to 18, 10 to 18, or 16 to 18, carbon atoms. In one embodiment, the organic group is further defined as a methyl group. In another embodiment, the organic group is further defined as an alkyl group having from 2 to 20 carbon atoms. In still other embodiments, the organic group is further defined as an alkyl group having from 4 to 17, from 5 to 16, from 6 to 15, from 7 to 14, from 8 to 13, from 9 to 12, or 10 or 11, carbon atoms. It is also contemplated that the organic group may have any number, or range of numbers, of carbon atoms within those ranges set forth above and that the aforementioned number of carbon atoms can vary by ±5%, ±10%, ±15%, ±20%, ±25%, ±30%, etc.

Physical Properties of the Functionalized Surface:

The surface (20) of the semiconductor, after being functionalized, is resistant to oxidation, i.e., formation of bonds between oxygen atoms and atoms of the Group III element of the surface (20). Accordingly, the functionalized surface typically has less than or equal to about 10, 5, 4, 3, 2, or 1, atom of the Group III element bonded to an oxygen atom per every 1,000 atoms of the Group III element bonded to the organic groups, as determined using X-ray photoelectron spectroscopy. Said differently, the functionalized surface typically has less than or equal to about 1, 0.5, 0.4, 0.3, 0.2, or 0.1, percent of oxide content based on a total number of atoms subject to (or "visible" by) X-ray photoelectron spectroscopy. In one embodiment, the detection limit of X-ray photoelectron spectroscopy is about 0.1% such that spectra that do not show a peak corresponding to oxide formation, i.e., an oxygen bond, indicate that less than about 0.1% of oxide content is present. The X-ray photoelectron spectroscopy measurements or determinations, according to this invention, can be made immediately after functionalization of the surface (e.g., at a time of zero) or at/after any interval of time thereafter, typically up to about 75 to 90 minutes after functionalization. In one embodiment, the functionalized surface has less than about 0.4 nm of oxide content. In other embodiments, the functionalized surface has less than about 0.35, 0.3, 0.25, 0.2, 0.15, or 0.1, nm of oxide content. In still other embodiments, the functionalized surface has about one, or less than about one, monolayer of oxide content.

Figure 7:
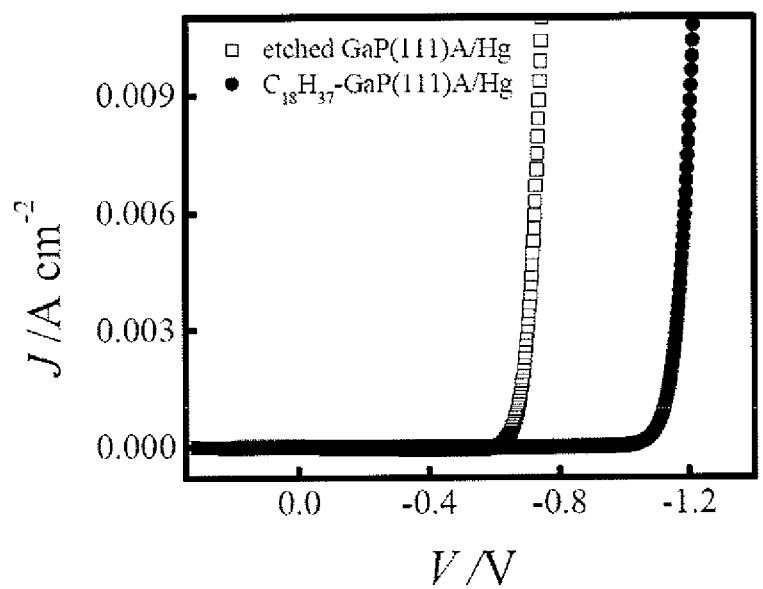
FIG. 7 is a graph illustrating current voltage response for contacts between Hg and (1) the surface of GaP(111)A after etching with $H_2SO_4$ and (2) the surface of GaP(111)A after etching with $H_2SO_4$, halogenation of gallium atoms, and reaction of halogenated gallium atoms with $C_{18}H_{37}MgCl$ to functionalize the surface, and showing that the functionalized surface requires less voltage for operation.
Figure 12:
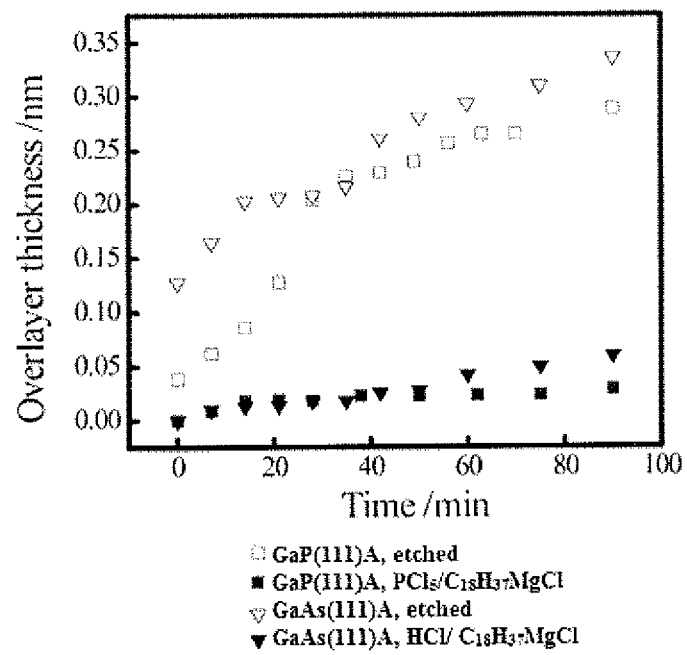
FIG. 12 is a plot showing a thickness of an oxidation layer (nm) on the surface of (1) GaP(111)A etched, (2) GaP(111)A etched, halogenated with $PCl_5$, and reacted with $C_{18}H_{37}MgCl$ to functionalize the surface, (3) GaAs(111)A etched, and (4) GaAs(111)A etched, halogenated with HCl in ether, and reacted with $C_{18}H_{37}MgCl$ to functionalize the surface, as a function of time.

The surface (20) of the semiconductor, after being functionalized, typically has a Wetting Contact Angle (θ) of water droplets of >40°, >50°, >60°, >70°, >80°, >90°, >100°, >110°, or >120°, as determined using the method described below in the Examples. Some non-limiting examples of Wetting Contact Angles are shown in FIGS. 3 and 10. In addition, the functionalized surface typically has an overlayer oxidation thickness of less than about 0.025 nm after 20, 30, 40, or 50 minutes of exposure to the ambient air at about 25° C. and atmospheric pressure and less than about 0.05 nm after 60, 70, 80, or 90 minutes of exposure to the same ambient air. Non-limiting examples of thicknesses of overlayer oxidation are set forth in FIG. 12. In addition, the functionalized surface (e.g. GaAs) typically has a dark current-voltage response (current density as a function of potential) of less than about 0.1 mA cm$^{-2}$ at −0.5 V, for contacts between Hg and the functionalized surface, as set forth in FIG. 13. Alternatively, the functionalized surface (e.g. GaP) can have a current voltage response as shown in FIG. 7. In other embodiments, the functionalized surface (e.g. GaAs) has an electrical stability (potential as a function of scan number) that corresponds to a slope of less than $3.3\times10^{-3}$ V/scan, less than $1.1\times10^{-3}$ V/scan, or about $8.7\times10^{-4}$ V/scan, or even less, as set forth in FIG. 14. It is also contemplated that any one or more of the aforementioned values may be any number, or range of numbers, of within those ranges set forth above and that the aforementioned number of carbon atoms can vary by ±5%, ±10%, ±15%, ±20%, ±25%, ±30%, etc.

Method of Functionalizing the Surface of the Semiconductor to Resist Oxidation: Etching the Semiconductor:

The method of functionalizing the surface (20) of semiconductor to resist oxidation may include the step of etching the surface (20) of the semiconductor. The step of etching the surface (20) is not limited to use of any particular temperature or pressure and need not occur for any particular length of time. The surface (20) may be etched with an acid, such as a strong acid. Suitable non-limiting examples of strong acids that can be used in this invention include HCl, $HNO_3$, $H_2SO_4$, HBr, HI, and/or $HClO_4$. Weaker acids can also be used. Alternatively, the surface (20) may be etched with a base, such as an alkaline- or alkaline earth-metal hydroxide, such as KOH. The acid or base may be used neat or may be diluted in a solvent. The surface (20) may be etched with any amount of the acid or base. Said differently, the instant invention is not limited to use of a particular weight, volume, or molar amount of the acid or base. Typically, Group III element-phosphides and arsenides are etched using a strong acid, such as sulfuric acid ($H_2SO_4$). Group III element-nitrides are typically etched using a strong base, such as KOH. The choice of particular etching acids or bases is typically based on the strength of the acids and bases and whether the acids and bases degrade the surface (20) of the semiconductor. Most typically, the acids and bases that are used to etch the surface (20) do not overly degrade or pit the surface (20). Most typically, before etching, the surface (20), which may be polished, has a root mean square roughness of about 0.2 nm, as determined using atomic force microscopy. After etching, the surface (20) typically has a similar root mean square roughness. However, the invention is not limited to such a roughness and the surface (20) may have a root mean square roughness that is greater or less than 0.2 nm. In one embodiment, the step of etching is specifically free of/does not utilize hydrofluoric acid (HF).

Figure 2:
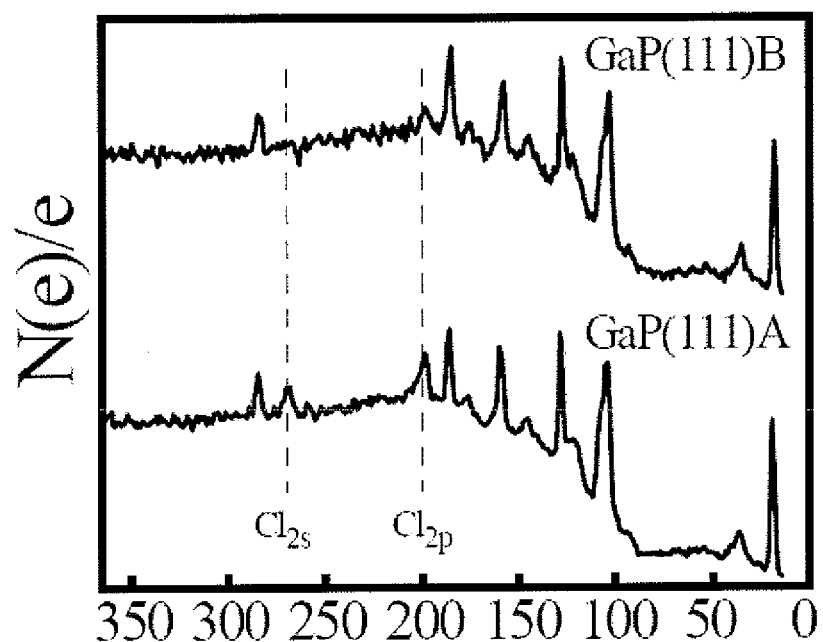
FIG. 2 is a $C_{1s}$ XP spectra illustrating (1) N(e) as a function of binding energy of the surface of GaP(111)B (top) and GaP(111)A (bottom) after halogenation of gallium atoms with $PCl_5$ and also illustrating (2) that the surface of GaP (111)A is selectively chlorinated.
Figure 8:
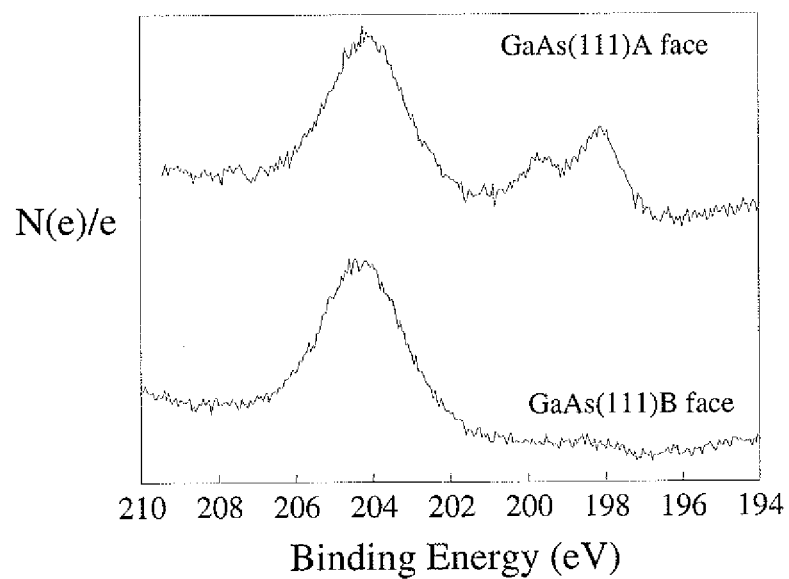
FIG. 8 is a $C_{1s}$ XP spectra illustrating N(e) as a function of binding energy of the surface of GaAs(111)A (top) and GaAs(111)B (bottom) after halogenation of gallium atoms with HCl in ether and also illustrating that the surface of GaAs (111)A is selectively chlorinated.
Figure 15:
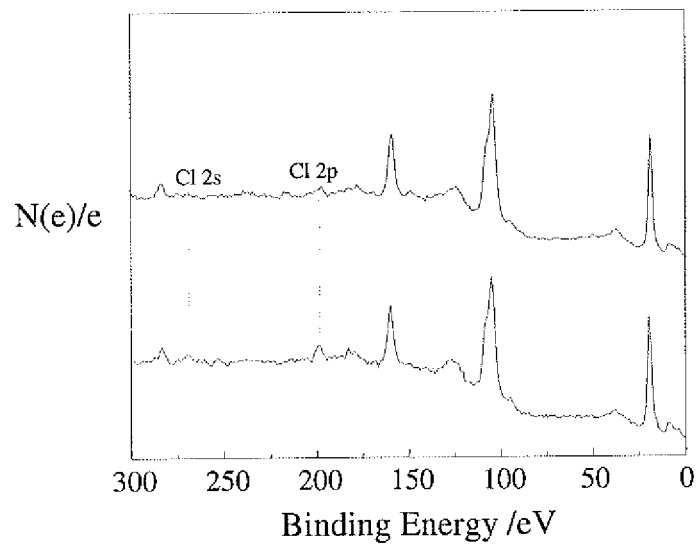
FIG. 15 is an XP spectra illustrating N(e) as a function of binding energy of (1) the surface of GaN(0001) after etching with KOH (top) and (2) the surface of GaN(0001) after etching with KOH and halogenation of gallium atoms with $PCl_5$ (bottom)
Figure 16:
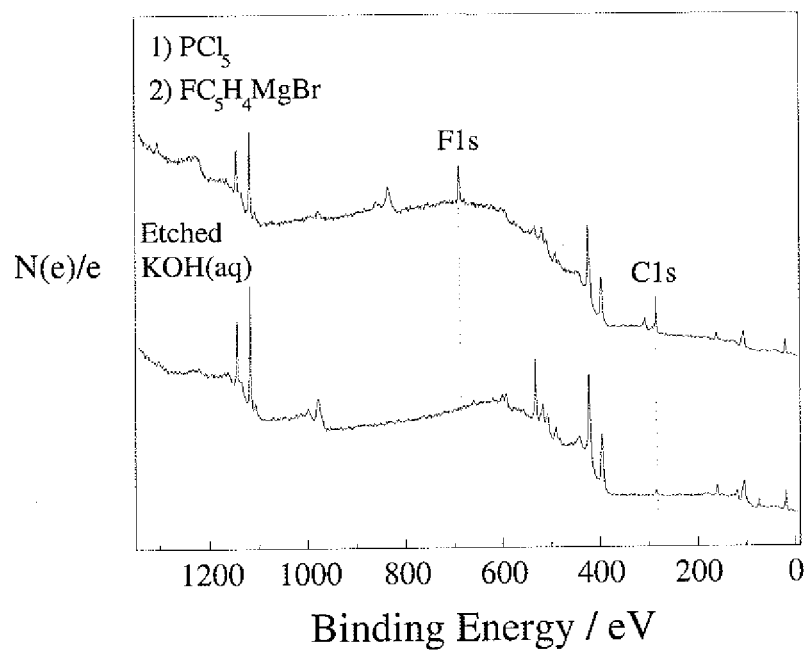
FIG. 16 is a $C_{1s}$ $F_{1s}$ XP spectra illustrating N(e) as a function of binding energy of (1) the surface of GaN(0001) etched and after halogenating at least one of the plurality of atoms of gallium with $PCl_5$ to form halogenated gallium and reacting at least one of the halogenated gallium atoms with FC$_5$H$_4$MgBr to functionalize the surface (top) and (2) the surface of GaN(0001) after etching (bottom), and also illustrating the successful alkylation of GaN(0001).

Halogenating at Least One of the Plurality of Atoms of the Group III Element:

Notwithstanding the step of etching the surface (20), the method includes the step of halogenating at least one of the plurality of atoms of the Group III element to form halogenated Group III element atoms, as shown in FIGS. 2, 8, and 15. The atoms of particular faces or planes of the semiconductor (e.g., 111(A)) may be preferentially halogenated as compared to other faces or planes (e.g., 111(B)).

The step of halogenating typically occurs after the step of etching, if utilized. The step of halogenating may include fluorinating, chlorinating, brominating, and/or iodinating or any other halogenating method known in the art. The step of halogenating may be further defined as reacting at least one of the plurality of atoms of the Group III elements with a halogenating agent. The step of halogenating is not limited to any particular halogen and typically includes reaction of chlorinating and/or brominating agents with at least one of the plurality of atoms of the Group III element to covalently bond a chlorine or bromine atom to the atom of the Group III element. Suitable non-limiting examples of halogenating agents include $PX^a_5$, $X^a_3CCOCX^b_3$, $X^a_3CCN$, $X^a_3CCO_2Et$, $X^a_3CCX^b_3$, $X^a_3CCONH_2$, $SOX^a_2$, $PX^a_3$, halogen gases ($X^a_2$), organo-fluorines, -chlorines, -bromines, and -iodines, -fluorides, -chlorides, and -bromides, halogenated hydrocarbons, halogenated solvents such as HCl and other halogenated acids, HCl in ether, and combinations thereof, wherein halogen atoms (e.g. $X^a$, $X^b$) may be the same or different and may independently include fluorine, chlorine, bromine, and/or iodine. It is also contemplated that $X^a$ and $X^b$ may represent more than one halogen at the same time. As just one example, $X^a_3CCX^b_3$ may be further defined as ClBrFCCClBrF, wherein each of $X^a$ and $X^b$ may represent more than one halogen at the same time. In one embodiment, the halogenating agent is further defined as phosphorus pentachloride ($PCl_5$). In another embodiment, the halogenating agent is further defined as thionyl chlorine ($SOCl_2$). Typically, a halogenating agent is chosen such that the surface (20) of the semiconductor is not degraded or pitted, as described above. In one embodiment, at least some of the plurality of atoms of the Group III element are covalently bonded to phosphorous and the step of halogenating is further defined as reacting at least one of the plurality of atoms of the Group III element with $PCl_5$. In another embodiment, at least some of the plurality of atoms of the Group III element are covalently bonded to arsenic and the step of halogenating is further defined as reacting at least one of the plurality of atoms of the Group III element with HCl in ether. In still another embodiment, at least some of the plurality of atoms of the Group III element are covalently bonded to nitrogen and the step of halogenating is further defined as reacting at least one of the plurality of atoms of the Group III element with $PCl_5$. The halogenating agent is not limited in this invention and may include any known in the art.

In one embodiment, at least one of the plurality of atoms of the Group III elements is reacted with a chlorinating agent, e.g. phosphorus pentachloride ($PCl_5$), resulting in Cl-surface coverage of about 1.16±0.03 monolayers as determined using x-ray photoelectron spectroscopy (XPS). Alternatively, the halogen, or Cl, surface (20) coverage may range from 0.05 to greater than 1.16 monolayers as determined using x-ray photoelectron spectroscopy. In various embodiments, the surface coverage ranges from about 0.95 to 1.10, from about 0.95 to 1.05, from about 1.00 to 1.10, or from about 1.00 to 1.5, monolayers as determined using x-ray photoelectron spectroscopy.

The step of halogenating may occur in/utilize an inert atmosphere, a reactive (e.g. oxygenated) atmosphere, or both inert and reactive atmospheres. Typically, the step of halogenating occurs under an inert atmosphere. The inert atmosphere may include any inert gas including, but not limited to, nitrogen ($N_2$), one or more noble gases, and combinations thereof. The inert atmosphere may include an alternative gas that is not oxygen, as is known in the art. The step of halogenating may also occur at any temperature and pressure and may be undertaken for any amount of time. Those of skill in the art will select an appropriate atmosphere, temperature, pressure, and time for the step of halogenating.

Reacting at Least One Halogenated Atom of the Group III Element with a Grignard Reagent:

The method also includes the step of reacting at least one of the halogenated atoms of the Group III element with a Grignard reagent (that includes the organic group(s)) to form a bond between the at least one Group III element atom and the organic groups and functionalize the surface (20) of the semiconductor to resist oxidation, as shown in FIGS. 4-6, 9, 11, and 16. The steps of halogenating and reacting may occur simultaneously or nearly simultaneously. The halogenated atoms of particular faces or planes of the semiconductor (e.g., 111(A)) may preferentially react with the Grignard reagent as compared to the atoms of other faces or planes (e.g., 111(B)), as shown in FIGS. 2 and 9.

Typically, Grignard reagents include, but are not limited to, alkyl- and aryl-metal halides such as alkyl- and aryl-magnesium halides. Alternatively, the Grignard reagent may include any alkylated- or arylated-alkali metal halide or alkaline earth metal halide that can act as a nucleophile, such as alkyl- and aryl-lithium halides. The chemical formula for the Grignard reagent may be R-M-X, wherein R is a substituted or unsubstituted alkyl or aryl group, M is a metal such as an alkali metal or alkaline earth metal, and X is a halide.

In various embodiments, R is further defined, for example, as a substituted or unsubstituted alkyl, aryl, alkenyl, alkynyl, aliphatic, cycloaliphatic, or aromatic, group. Alternatively, R may be further defined as a functionalized alkyl or aryl group bonded to, for example, a halogen atom. In various embodiments, R is a substituted or unsubstituted alkyl or aryl group having from 1 to 50, 1 to 40, 1 to 30, 1 to 20, 5 to 20, 5 to 15, 5 to 10, 10 to 30, 10 to 20, 15 to 30, 15 to 20, 3 to 18, 5 to 18, to 18, or 16 to 18, carbon atoms. In one embodiment, R is further defined as a methyl group. In another embodiment, R is further defined as an alkyl group having from 2 to 20 carbon atoms. In still other embodiments, R is further defined as an alkyl group having from 4 to 17, from 5 to 16, from 6 to 15, from 7 to 14, from 8 to 13, from 9 to 12, or 10 or 11, carbon atoms. In various embodiments, R is further defined as $CH_3$ (e.g. from $CH_3MgCl$), $C_8H_{17}$ (e.g. from $C_8H_{17}MgCl$), $C_{14}H_{29}$ (e.g. from $C_{14}H_{29}MgCl$), or $C_{18}H_{37}$ (e.g. from $C_{18}H_{37}MgCl$). It is contemplated that a single Grignard reagent, or two or more Grignard reagents, e.g., $CH_3MgCl$ and $C_{18}H_{37}MgCl$, may be utilized. Suitable, but non-limiting, examples of Grignard reagents include $C_nH_{2n+1}MgCl$ (wherein n is a number of from 1 to 50), $C_2H_3BrMg$, $C_2H_3ClMg$, $C_3H_5BrMg$, $C_4H_7BrMg$, $CH_3BrMg$, $CH_3ClMg$, $CH_3IMg$, $C_2H_5BrMg$, $C_2H_5ClMg$, $C_3H_5BrMg$, $C_3H_7BrMg$, $C_3H_7Cl_2LiMg$, $C_4H_7BrMg$, $C_4H_7ClMg$, $C_4H_9BrMg$, $C_4H_9ClMg$, $C_4H_9Cl_2LiMg$, $C_4H_{11}ClMgSi$, $C_5H_9BrMg$, $C_5H_9ClMg$, $C_5H_{10}Br_2Mg_2$, $C_5H_{11}BrMg$, $C_6H_{11}BrMgO_2$, $C_6H_{11}ClMg$, $C_6H_{13}BrMg$, $C_7H_6Br_2Mg$, $C_7H_6ClFMg$, $C_7H_7ClMg$, $C_7H_{13}BrMg$, $C_7H_{15}MgBr$, $C_8H_9ClMg$, $C_8H_{17}BrMg$, $C_8H_{17}ClMg$, $C_9HCl_9BrMg$, $C_{10}H_{13}ClMg$, $C_{10}H_{21}BrMg$, $C_{11}H_9BrMg$, $C_{12}H_{25}BrMg$, $C_{14}H_{29}ClMg$, $C_{15}H_{31}BrMg$, $C_{18}H_{37}ClMg$, $C_2HBrMg$, $C_2HClMg$, $C_3H_3BrMg$, $C_8H_5BrMg$, $C_6BrF_5Mg$, $C_6H_2BrF_3Mg$, $C_6H_3BrClFMg$, $C_6H_3BrClFMg$, $C_6H_3BrCl_2Mg$, $C_6H_3BrF_2Mg$, $C_6H_4BrClMg$, $C_6H_4BrFMg$, $C_6H_4BrFMg$, $C_6H_5BrMg$, $C_6H_5ClMg$, $C_7H_4BrF_3MgO$, $C_7H_4BrF_6Mg$, $C_7H_6BrClMg$, $C_7H_6BrFMg$, $C_7H_6ClFMg$, $C_7H_7BrMg$, $C_7H_7BrMgS$, $C_7H_7ClMg$, $C_8H_9BrMg$, $C_8H_9ClMg$, $C_8H_{10}BrMgN$, $C_9H_{11}BrMg$, $C_{10}H_7BrMg$, $C_{10}H_{13}BrMg$, $C_{11}H_9BrMg$, $C_{11}H_{14}BrMgN$, $C_{12}H_9BrMg$, $C_{12}H_{16}BrMgN$, $C_{14}H_9BrMg$, $C_{14}H_{18}BrMgNO_2$, $C_{15}H_{23}BrMg$, $C_4H_2BrClMgS$, $C_4H_3BrMgS$, $C_4H_{31}MgS$, $C_5H_5BrMgS$, $C_8H_{18}Mg$, isomers thereof, and combinations thereof. Alternatively, the Grignard reagent may be further defined as, or as including, $C_{11}H_{14}BrMgNO$, $C_{11}H_{14}BrMgNO$, $C_{11}H_{14}BrMgNO$, $C_{12}H_{22}ClMgNSi_2$, $C_9H_{18}Cl_2LiMgN$, $C_{11}H_{25}LiMg$, $C_{12}H_{27}LiMg$, isomers thereof, and combinations thereof.

It is also contemplated that the Grignard reagent may be further defined as having the aforementioned R-M-X structure wherein R is not an alkyl group and instead includes one or more of an alkene, alkyne, nitrile, ether, thiol, sulfide, epoxide, carboxylic acid, ester, aldehyde, ketone, alcohol, amine, amide, benzyl, phenyl, phenol, multi-ringed group, or combination thereof, so long as each includes a carbon atom. Said differently, R is not particularly limited and may include any functional group known in the art so long as reaction of the semiconductor and the Grignard reagent produces a carbon-Group III element (e.g. a carbon-gallium) bond. Typically, a carbon atom is bonded to the metal of the Grignard reagent such that the Grignard reagent forms the carbon-Group III element bond. Also, the halogenation of the atoms of the Group III element typically prepares the atoms for reaction with the Grignard reagent and makes the carbon-Group III element bond forming reaction more favored thermodynamically and/or kinetically.

The step of reacting at least one of the halogenated atoms of the Group III element with the Grignard reagent may occur at any temperature and pressure and may be undertaken for any amount of time. Those of skill in the art will select an appropriate atmosphere, temperature, pressure, and time. Typically, the step of reacting with the Grignard reagent occurs under an inert atmosphere.

The at least one of the halogenated atoms of the Group III element may be reacted with any amount of the Grignard reagent. Said differently, the instant invention is not limited to use of a particular weight, volume, or molar amount of the Grignard reagent. In one embodiment, a molar excess of the Grignard reagent is used relative to the number of moles of the halogenated atoms of the Group III element. It is also contemplated that approximately a 1:1 molar ratio of Grignard reagent to the halogenated atoms of the Group III element may be utilized. In one embodiment, the surface (20) of the semiconductor is submerged in a solution of Grignard reagent. Typically, the solution includes a molar excess of the Grignard reagent relative to the number of moles of the halogenated atoms of the Group III element.

Various Additional Embodiments

In one embodiment, the semiconductor includes the body and the surface (20) and the surface (20) is etched using acid, such as sulfuric acid. Then, the semiconductor is introduced into an inert atmosphere and immersed in a saturated solution of a halogenating agent (e.g. $PCl_5$) in a solvent such as chlorobenzene which may include a peroxide such as benzoyl peroxide. The saturated solution including the semiconductor is then heated to a temperature of from 90 to 100° C. for about 50 minutes to halogenate the atoms of the Group III element. The semiconductor is then typically removed from the saturated solution and rinsed with a second solvent which also may be chlorobenzene. Typically, after rinsing, the semiconductor is allowed to dry in the inert atmosphere. Subsequently, the semiconductor is submerged in a solution including the Grignard reagent for a time of 1 to 5, 2 to 4, or 2 to 3 hours at varying temperatures of from 50 to 150° C., 65 to 70° C., or 145 to 150° C., to react the Grignard regent with the halogenated atoms of the Group III element and functionalize the surface. Alternatively, the semiconductor may be submerged in solution including the Grignard reagent for a time of 10 to 20 hours, e.g. about 13 hours, at temperatures of from 65-70° C. Subsequently, the semiconductor is removed from solution and rinsed with a third solvent, such as THF and/or methanol. The semiconductor having the functionalized surface may then be allowed to dry again in the inert atmosphere.

In other embodiments, the body and/or surface (20) of the semiconductor is free of thiols, sulfides, and/or sulfur-containing compounds. Alternatively, the semiconductor body and/or surface (20) includes less than 1, less than 0.1, less than 0.05, or less than 0.01 weight percent of thiols, sulfides, and/or sulfur-containing compounds based on a total weight of the semiconductor. Alternatively, the body and/or surface (20) of the semiconductor may include less than 1, less than 0.1, less than 0.05, or less than 0.01 mole percent of thiols, sulfides, and/or sulfur-containing compounds based on a total molar weight of the semiconductor.

Article Including the Semiconductor:

Referring back to the article introduced above, the article includes the semiconductor that has the functionalized surface. The article is not particularly limited and may be further defined as a solar cell module or array of modules, a solar-powered water electrolysis device, an optoelectronic device, etc. The article may be formed by any method known in the art and is not limited to any one particular method of forming.

EXAMPLES

Three series of semiconductors having surfaces that are functionalized are prepared according to the instant invention. Control samples of similar semiconductors are also prepared. The control samples do not have surfaces that are functionalized. The semiconductors in the first series include gallium phosphide. The semiconductors in the second series include gallium arsenide. The semiconductors in the third series include gallium nitride. The semiconductors of each series are evaluated to determine various physical properties.

First Series of Semiconductors:

Evaluation of Halogenation:

n-type GaP(111) A and B semiconductor wafers (miscut <0.5°, El-Cat) are contacted with $H_2SO_4$ for 30 seconds to etch their surfaces. Subsequently, samples of the A and B wafers are submerged for 50 minutes in chlorobenzene (Sigma Aldrich) saturated with $PCl_5$ (Sigma Aldrich) at 90° C., and then rinsed with neat chlorobenzene. Samples of the A and B wafers are then evaluated using $C_{1s}$ XP spectroscopy. The results of this spectroscopy are set forth in FIG. 2 and illustrate that GaP(111)A wafers are selectively chlorinated. These results are also summarized in Table 1 set forth immediately below:

TABLE 1

|  | GaP(111)A Wafers | GaP(111)B Wafers |
|---|---|---|
| Etched with $H_2SO_4$ for 30 seconds | Yes | Yes |
| Exposed to $PCl_5$ at 90° C. | Yes | Yes |
| Halogenation of the GaP Wafers | Yes | No |

Evaluation of the Presence of Ga—C Bonding Using $C_{1s}$ XP Spectroscopy:

Additional samples of the A wafers are also etched and halogenated as described above. A portion of these samples are then immersed in a solution of $CH_3MgCl$ at 165° C. for 3 hours to functionalize the surfaces. After 3 hours, the wafers are rinsed with THF and methanol (JT Baker). These wafers are representative of the semiconductors instant invention. Another portion of these samples is not immersed in the solution and represent control samples because they are not functionalized.

The control samples and the wafers that are representative of the semiconductors of this invention are then evaluated using $C_{1s}$ XP spectroscopy. The results of these evaluations are set forth in FIG. 4 and suggest bonding between gallium and carbon of the semiconductors of this invention as evidenced by the shoulder at 282.7 eV. Accordingly, these results indicate that the functionalization of the semiconductors according to this invention is successful. These results are also summarized in Table 2 below.

TABLE 2

|  | Control Samples | Inventive Samples |
|---|---|---|
| Etched with $H_2SO_4$ for 30 seconds | Yes | Yes |
| Exposed to $PCl_5$ at 90° C. | Yes | Yes |
| Halogenation of the Samples | Yes | Yes |
| Exposure to Solution of $CH_3MgCl$ | No | Yes |
| Shoulder at 282.7 eV in XPS | No | Yes |
| Presence of Ga—C Bonding | No | Yes |

Evaluation of Effectiveness of Alkylation and Degree of Oxidation Using $P_{2p}$ XP Spectroscopy:

Control samples of the A wafers, etched as described above, are exposed to ambient conditions for 75 minutes. Samples of the A wafers that are etched and halogenated and functionalized with either $CH_3MgCl$ or $C_{18}H_{37}MgCl$ are also exposed to ambient conditions for 75 minutes. Both before and after exposure to ambient conditions, the aforementioned samples are evaluated to determine the effectiveness of alkylation and a degree of oxidation using high resolution $P_{2p}$ XP spectra. As set forth in FIG. 5, the $P_{2p}$ XP spectra illustrate a difference in susceptibility of samples towards oxidation. Signals observed at binding energies between about 132 and 136 eV are diagnostic of surface $PO_x$ and are used to quantitatively assess a rate of surface oxidation resulting from exposure to ambient conditions.

Figure 6:
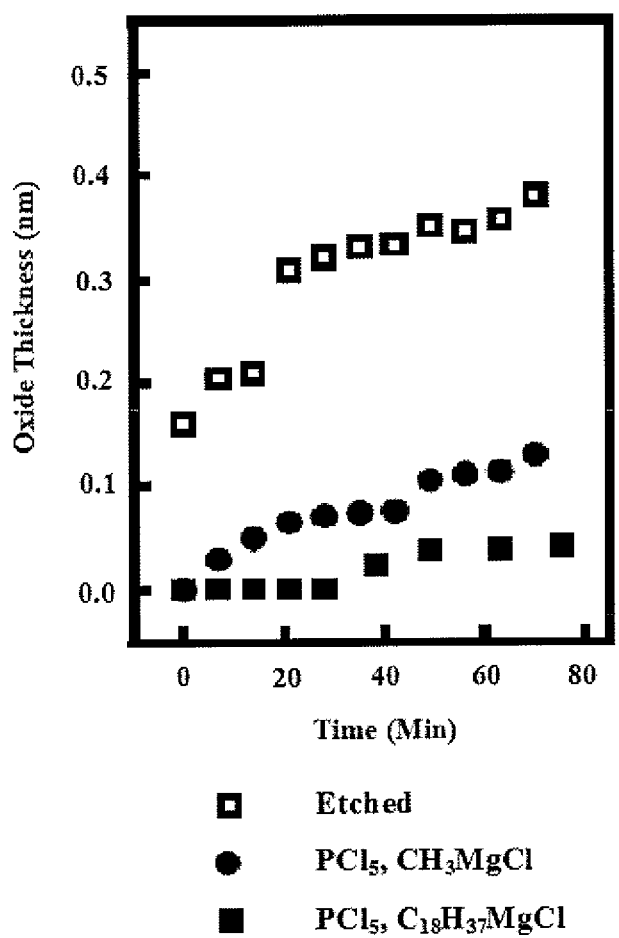
FIG. 6 is a graph illustrating oxide thickness (nm) on the surface of GaP(111)A as a function of time exposed to the ambient environment wherein (1) the surface of GaP(111)A is etched but not functionalized, (2) the surface is etched, the gallium atoms are halogenated, and the halogenated atoms are reacted with $CH_3MgCl$ to functionalize the surface, or (3) the surface is etched, the gallium atoms are halogenated, and the halogenated atoms are reacted with $C_{18}H_{37}MgCl$ to functionalize the surface.

As shown in FIG. 6, control samples etched with $H_2SO_4$ and reacted with laboratory air exhibit rapid formation of oxide on a time scale of minutes. Additionally, wafers whose surfaces are functionalized with $CH_3MgCl$ exhibit a lower rate of oxide formation, with an estimated oxide layer thickness less than half that observed at a native surface after 1 hr. Further, wafers whose surfaces are functionalized with $C_{18}H_{37}MgCl$ exhibit an even greater resistance against oxide formation and exhibit less than 0.1±0.04 nm of surface $PO_x$ after 80 minutes. Without intending to be bound by any particular theory, it is believed that steric blocking effects imparted by grafted alkyl groups result in a kinetic inhibition of oxide formation. After functionalization with $CH_3MgCl$, residual Cl is apparent in the XP spectra. These signatures are removed after additional sonication in $CH_3OH$ for 2 minutes without alteration of a low binding energy shoulder in the high resolution $C_{1s}$ XP spectra or perturbation of observable wetting properties. These results are also summarized in Table 3 below.

TABLE 3

|  | Control Samples | Inventive Sample 1 | Inventive Sample 2 |
|---|---|---|---|
| Etched with $H_2SO_4$ for 30 seconds | Yes | Yes | Yes |
| Exposed to $PCl_5$ at 90° C. | No | Yes | Yes |
| Halogenation of the Samples | No | Yes | Yes |
| Exposure to Solution of $CH_3MgCl$ | No | Yes | No |
| Exposure to Solution of $C_{18}H_{37}MgCl$ | No | No | Yes |
| Resistance to Oxidation After 75 Minutes | No | Yes | Yes |

Evaluation of Wetting Character—Determination of Wetting Contact Angles (θ):

The control samples described above (etched but not halogenated or functionalized) and samples of the functionalized wafers (functionalized with $CH_3MgCl$ or $C_{18}H_{37}MgCl$) described above are also evaluated to determine an amount of alkylation resulting from reaction with the Grignard reagent. More specifically, each of the samples is wet with water to form droplets thereon. The Wetting Contact Angles (θ) of the droplets are then measured to determine an amount of water beading that occurs. The Wetting Contact Angles are measured using a CAM 100 optical contact angle meter (KSV instrument, Helsinki, Finland). More specifically, 2.2 µL water droplets are dispensed onto each of the samples to determine Wetting Contact Angles which are recorded and analyzed using a KSV software analysis package. In these evaluations, a higher Wetting Contact Angle indicates a more spherical water bead, as illustrated in FIGS. 3A-3C, resulting from an increased hydrophobicity of the surfaces indicating a higher degree of alkylation/functionalization from reaction with the Grignard reagent.

Figure 3A:
FIG. 3A is a side view of a water droplet disposed on a surface of GaP(111)A that is etched allowing for calculation of a Wetting Contact Angle (θ) of about 19.9°±0.9°.
Figure 3B:
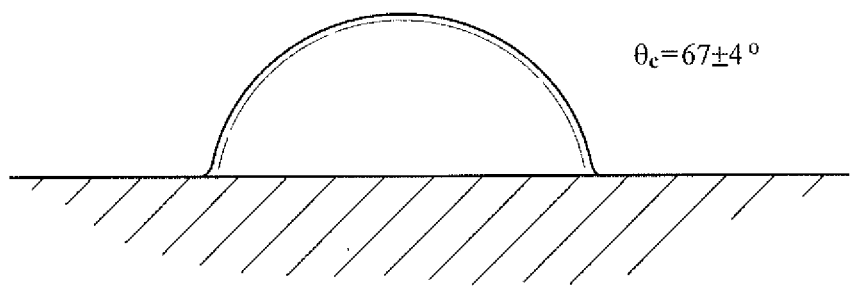
FIG. 3B is a side view of a water droplet disposed on a surface of GaP(111)A after halogenated gallium atoms react with $CH_3MgCl$ allowing for calculation of a Wetting Contact Angle (θ) of about 67°±4'.
Figure 3C:
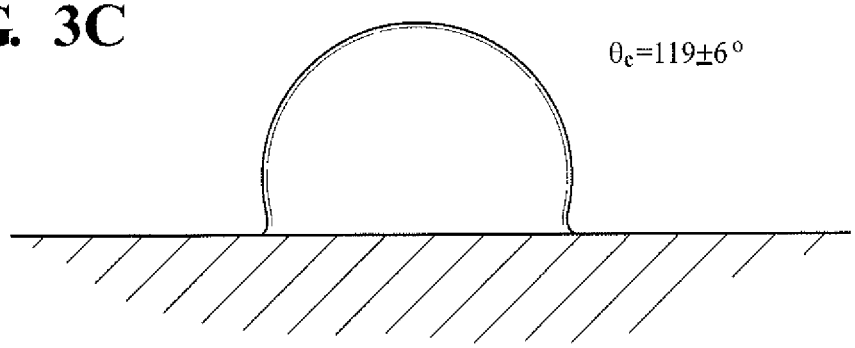
FIG. 3C is a side view of a water droplet disposed on a surface of GaP(111)A after halogenated gallium atoms react with $C_{18}H_{37}MgCl$ allowing for calculation of a Wetting Contact Angle (θ) of about 119°±6°.
Figure 4:
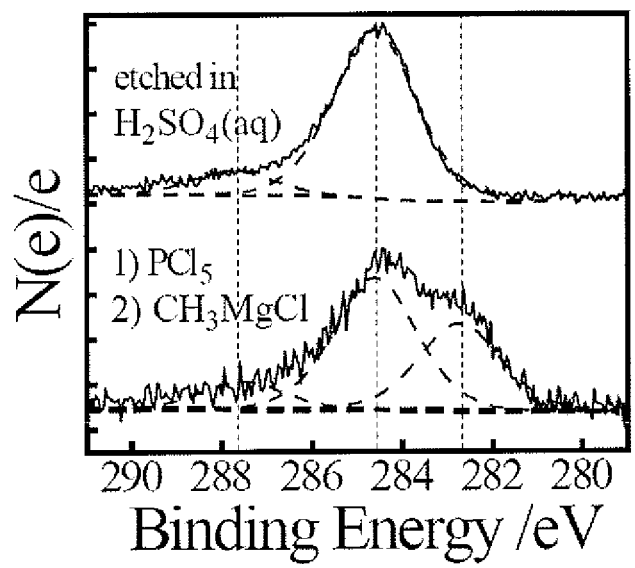
FIG. 4 is a $C_{1s}$ XP spectra illustrating N(e) as a function of binding energy of the surface of GaP(111)A etched using $H_2SO_4$ (top) and also of the surface of GaP(111)A after halogenating at least one of the plurality of atoms of gallium with $PCl_5$ to form halogenated gallium and reacting at least one of the halogenated gallium atoms with $CH_3MgCl$ (bottom)
Figure 5A:
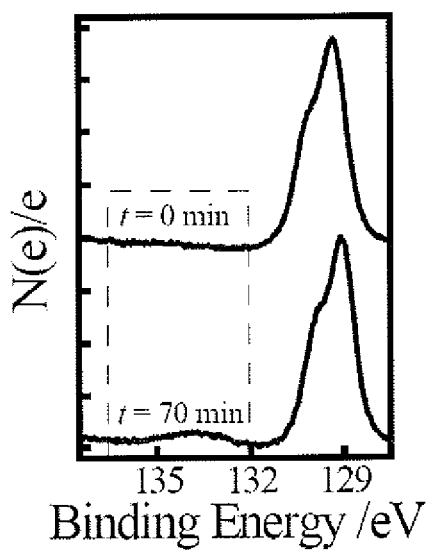
FIG. 5A is a $P_{2p}$ spectra illustrating N(e) as a function of binding energy of the surface of GaP(111)A after etching, halogenation, and reacting at least one of the halogenated gallium atoms of the surface with $CH_3MgCl$ and showing minimal oxidation of the surface after 70 minutes.
Figure 5B:
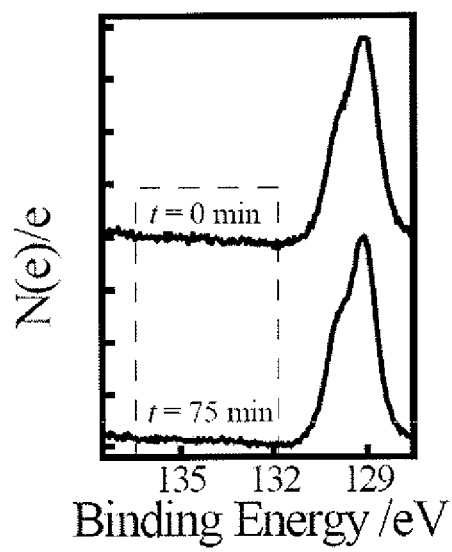
FIG. 5B is a $P_{2p}$ spectra illustrating N(e) as a function of binding energy of the surface of GaP(111)A after etching, halogenation, and reacting at least one of the halogenated gallium atoms of the surface with $C_{18}H_{37}MgCl$ and showing no detectable oxidation of the surface after 75 minutes.
Figure 5C:
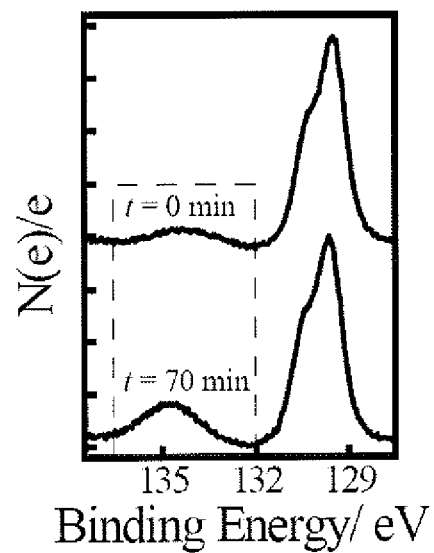
FIG. 5C is a $P_{2p}$ spectra illustrating N(e) as a function of binding energy of the surface of GaP(111)A after etching with $H_2SO_4$ and showing extensive oxidation of the surface after 70 minutes of exposure to ambient air.

Relative to the control samples, the water droplets have a Wetting Contact Angle of about 19.9°±0.9°, as illustrated in FIG. 3A, representing no functionalization. Relative to the wafers whose surfaces are functionalized with $CH_3MgCl$, the water droplets have a Wetting Contact Angle of about 67°±4°, as illustrated in FIG. 3B. Relative to the wafers whose surfaces are functionalized with $C_{18}H_{37}MgCl$, the water droplets have a Wetting Contact Angle of about 119°±6°, as illustrated in FIG. 3C. In still other evaluations, control samples are immersed in a THF solution in the absence of any Grignard reagent and subsequently wet with water droplets. In these evaluations, the water droplets have a Wetting Contact Angle of <40°, thus also representing no functionalization through reaction with Grignard reagents.

Each of the aforementioned samples is reevaluated for Wetting Contact Angle after 42 days of exposure to ambient conditions on a bench top. In each case, wherein the surfaces of the wafers are functionalized, the Wetting Contact Angles remain high. The results of these evaluations suggest that when the surfaces of the wafers are functionalized with $CH_3MgCl$ and/or $C_{18}H_{37}MgCl$, a tightly-packed monolayer of (long) chain alkanes is formed and that the functionalized semiconductor is stable. These results are also summarized in Table 4 below.

TABLE 4

|  | Control Samples | Inventive Sample 1 | Inventive Sample 2 |
|---|---|---|---|
| Etched with $H_2SO_4$ for 30 seconds | Yes | Yes | Yes |
| Exposed to $PCl_5$ at 90° C. | No | Yes | Yes |
| Halogenation of the Samples | No | Yes | Yes |
| Exposure to Solution of $CH_3MgCl$ | No | Yes | No |
| Exposure to Solution of $C_{18}H_{37}MgCl$ | No | No | Yes |
| Initial Wetting Contact Angle (°) | 19.9° ± 0.9° | 67° ± 4° | 119° ± 6° |
| Wetting Contact Angle (°) After 42 Days | <40° | >40° | >100° |

Evaluation of Current-Voltage Responses (J-V) of n-GaP (111)A/Hg Contacts:

The control samples and the functionalized wafers are also connected to Hg contacts and evaluated to determine a current-voltage response. As shown in FIG. 7, an additional 400 mV is needed to achieve the same forward bias current density after functionalization with $C_{18}H_{37}$-groups, suggesting a suppression of electron flow across interfaces due to alkylation of GaP(111)A. The responses are consistent across multiple devices and are insensitive to prior exposure of GaP interfaces to ambient conditions, suggesting an absence of macroscopic holes in a surface formed by alkyl groups attached to the GaP(111)A from reaction with the Grignard reagents. This data suggests that stable GaP metal-insulator-semiconductor (MIS) junctions can be formed using an organic insulating layer from reaction with the Grignard reagents. A consequence of decreased majority-carrier current flow in MIS devices is typically an enhancement of a photoresponse relative to standard Schottky junctions. Thus, the data suggest that a wet-chemical route for increasing photovoltage attainable with GaP is attainable and successful using the instant invention.

Second Series of Semiconductors:
Evaluation of Halogenation:

n-type GaAs(111) A and B semiconductor wafers (miscut <0.5°, El-Cat) are contacted with $H_2SO_4$ for 30 seconds to etch their surfaces. Subsequently, samples of the A and B wafers are submerged for 50 minutes in ether saturated with HCl at 25° C., and then rinsed with neat ether. Samples of the A and B wafers are then evaluated using $C_{1s}$ XP spectroscopy. The results of this spectroscopy are set forth in FIG. 8 and illustrate that GaAs(111)A wafers are selectively chlorinated. These results are also summarized in Table 5 set forth immediately below:

TABLE 5

|  | GaAs(111)A Wafers | GaAs(111)B Wafers |
|---|---|---|
| Etched with $H_2SO_4$ for 30 seconds | Yes | Yes |
| Exposed to HCl in ether at 25° C. | Yes | Yes |
| Halogenation of the GaAs Wafers | Yes | No |

Evaluation of the Presence of Ga—C Bonding Using $C_{1s}$ XP Spectroscopy:

Additional samples of the A wafers are also etched and halogenated as described above. A portion of these samples are then immersed in a solution of $C_{18}H_{37}MgCl$ at 165° C. for 3 hours to functionalize the surfaces. After 3 hours, the wafers are rinsed with THF and methanol (JT Baker). These wafers are representative of the semiconductors instant invention. Another portion of these samples is not immersed in the solution and represent control samples.

Figure 9A:
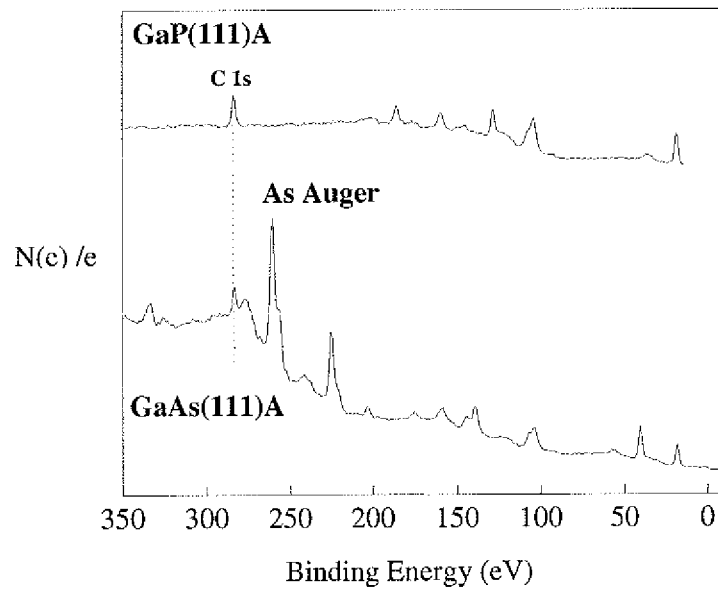
FIG. 9A is a $C_{1s}$ XP spectra illustrating N(e) as a function of binding energy of (1) the surface of GaP(111)A etched using $H_2SO_4$, after halogenating at least one of the plurality of atoms of gallium with $PCl_5$ to form halogenated gallium, and after reacting at least one of the halogenated gallium atoms of the surface with $C_{18}H_{37}MgCl$ to functionalize the surface (top) and (2) the surface of GaAs(111)A etched using $H_2SO_4$, after halogenating at least one of the plurality of atoms of gallium with HCl in ether to form halogenated gallium, and after reacting at least one of the halogenated gallium atoms with $C_{18}H_{37}MgCl$ to functionalize the surface (bottom)
Figure 9B:
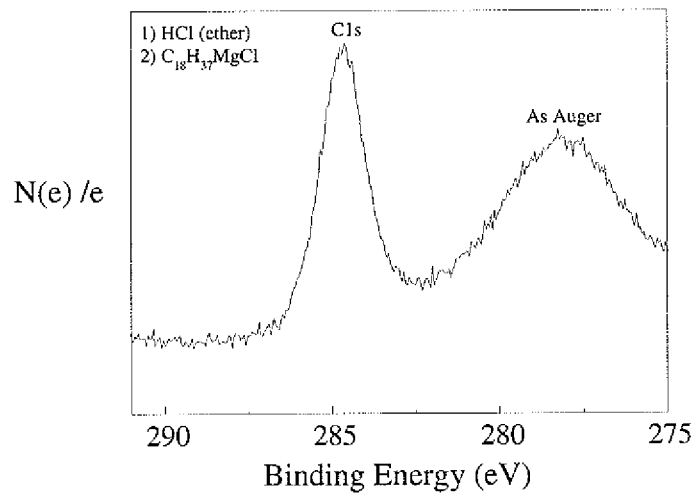
FIG. 9B is a highly resolved portion of the $C_{1s}$ XP spectra of the bottom of FIG. 9A showing a $C_{1s}$ peak next to an As Auger peak.

The control samples and the wafers that are representative of the semiconductors of this invention are then evaluated using $C_{1s}$ XP spectroscopy. The results of these evaluations are set forth in FIG. 9. FIG. 9A illustrates that the $C_{1s}$ peak of GaAs is convoluted by As Auger peaks. However, FIG. 9B, which is of higher resolution, shows the $C_{1s}$ peak of GaAs. Accordingly, these results indicate that the functionalization of the semiconductors according to this invention is successful. These results are also summarized in Table 6 below.

TABLE 6

|  | Control Samples | Inventive Samples |
|---|---|---|
| Etched with $H_2SO_4$ for 30 seconds | Yes | Yes |
| Exposed to HCl in ether at 25° C. | Yes | Yes |
| Halogenation of the Samples | Yes | Yes |
| Exposure to Solution of $C_{18}H_{37}MgCl$ | No | Yes |
| Presence of Ga—C Bonding | No | Yes |

Evaluation of Effectiveness of Alkylation and Degree of Oxidation Using $P_{2p}$ XP Spectroscopy:

Control samples of the A wafers, etched as described above, are exposed to ambient conditions for 75 minutes. Samples of the A wafers that are etched and halogenated and functionalized with $C_{18}H_{37}MgCl$ are also exposed to ambient conditions for 75 minutes. Both before and after exposure to ambient conditions, the aforementioned samples are evaluated to determine the effectiveness of alkylation and a degree of oxidation using high resolution $As_{3d}$ XP spectra. As set forth in FIG. 11, the $As_{3d}$ XP spectra illustrate a difference in susceptibility of samples towards oxidation. Signals observed at binding energies between about 44 and 48 eV are diagnostic of surface $AsO_x$ and are used to quantitatively assess a rate of surface oxidation resulting from exposure to ambient conditions.

Figure 11A:
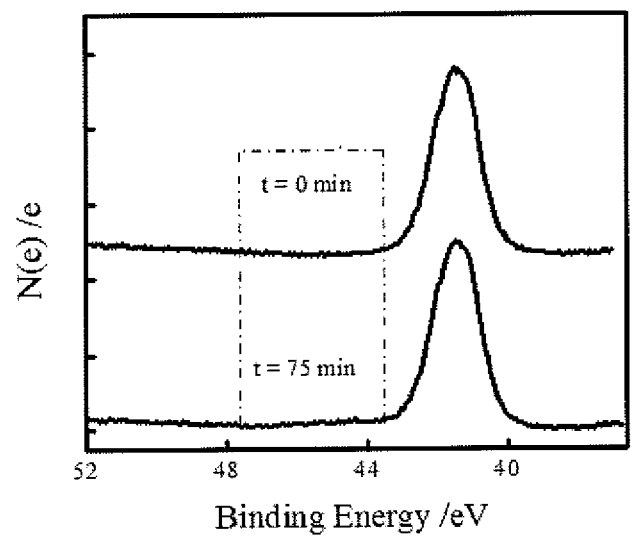
FIG. 11A is an $As_{3d}$ spectra illustrating N(e) as a function of binding energy of the surface of GaAs(111)A after etching, halogenation, and reacting at least one of the halogenated gallium atoms with $C_{18}H_{37}MgCl$ to functionalize the surface and also illustrating that alkylated GaAs shows no detectable oxidation after 75 minutes of exposure to ambient air.
Figure 11B:
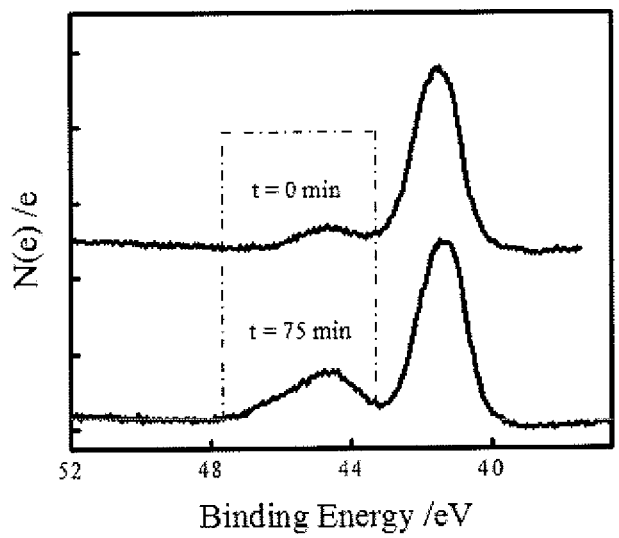
FIG. 11B is an $As_{3d}$ spectra illustrating N(e) as a function of binding energy of the surface of GaAs(111)A after etching with $H_2SO_4$ and also illustrating that non-alkylated GaAs is susceptible to oxidation after 75 minutes.

As shown in FIG. 11, control samples etched with $H_2SO_4$ and reacted with laboratory air exhibit rapid formation of oxide on a time scale of minutes. Additionally, wafers whose surfaces are functionalized with $C_{18}H_{37}MgCl$ exhibit a lower rate of oxide formation. These results are also summarized in Table 7 below.

TABLE 7

|  | Control Samples | Inventive Samples |
|---|---|---|
| Etched with $H_2SO_4$ for 30 seconds | Yes | Yes |
| Exposed to HCl in ether at 25° C. | No | Yes |
| Halogenation of the Samples | No | Yes |
| Exposure to Solution of $C_{18}H_{37}MgCl$ | No | Yes |
| Resistance to Oxidation After 75 Minutes | No | Yes |

Evaluation of Wetting Character—Determination of Wetting Contact Angles (θ):

The control samples described above (etched but not halogenated or functionalized) and samples of the functionalized wafers (functionalized with $C_8H_{17}MgCl$, $C_{14}H_{29}MgCl$, or $C_{18}H_{37}MgCl$) using the process described above are also evaluated to determine an amount of alkylation resulting from reaction with the Grignard reagent. More specifically, each of the samples is wet with water to form droplets thereon. The Wetting Contact Angles (θ) of the droplets are then measured to determine an amount of water beading that occurs, according to the process described above.

Relative to the control samples, the water droplets have a Wetting Contact Angle of about 45°±4°, as illustrated in FIG.

Figure 10A:
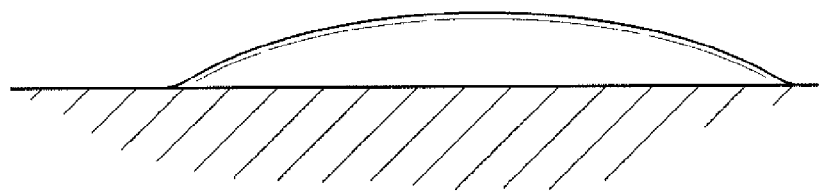
FIG. 10A is a side view of a water droplet disposed on a surface of GaAs(111)A that is etched allowing for calculation of a Wetting Contact Angle (θ) of about 45°±4°.
Figure 10B:
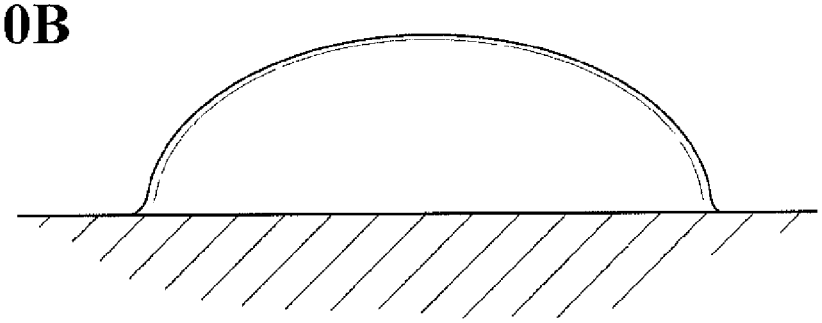
FIG. 10B is a side view of a water droplet disposed on a surface of GaAs(111)A after halogenated gallium atoms react with $C_8H_{17}MgCl$ allowing for calculation of a Wetting Contact Angle (θ) of about 85°±5°.
Figure 10C:
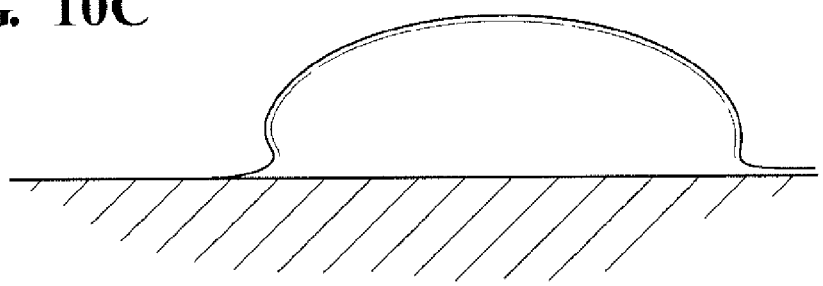
FIG. 10C is a side view of a water droplet disposed on a surface of GaAs(111)A after halogenated gallium atoms react with $C_{14}H_{29}MgCl$ allowing for calculation of a Wetting Contact Angle (θ) of about 99°±4°.
Figure 10D:
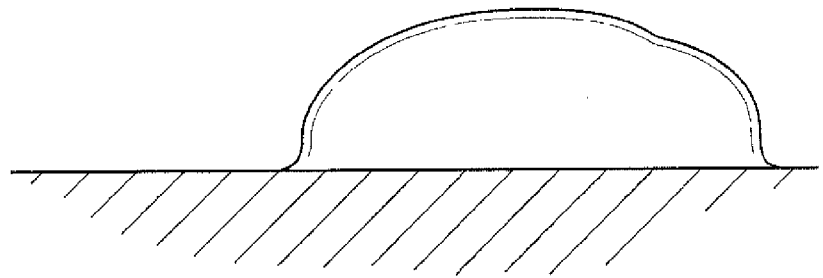
FIG. 10D is a side view of a water droplet disposed on a surface of GaAs(111)A after halogenated gallium atoms react with $C_{18}H_{37}MgCl$ allowing for calculation of a Wetting Contact Angle (θ) of about 107°±11°.
Figure 10E:
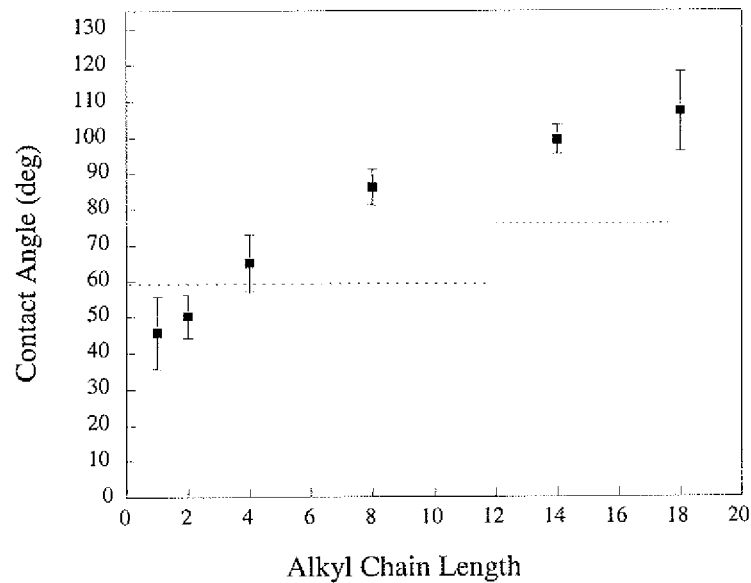
FIG. 10E is a plot showing Wetting Contact Angle (θ) as a function of number of carbon atoms functionalized onto the surface of GaAs(111)A.

10A, representing no functionalization. Relative to the wafers whose surfaces are functionalized with $C_8H_{17}MgCl$, the water droplets have a Wetting Contact Angle of about 85°±5°, as illustrated in FIG. 10B. Relative to the wafers whose surfaces are functionalized with $C_{14}H_{29}MgCl$, the water droplets have a Wetting Contact Angle of about 99°±4°, as illustrated in FIG. 10C. Relative to the wafers whose surfaces are functionalized with $C_{18}H_{37}MgCl$, the water droplets have a Wetting Contact Angle of about 107°±11°, as illustrated in FIG. 10D. These results are also summarized in Table 8 below. Additional results are summarized in FIG. 10E.

TABLE 8

|  | Control Samples | Inventive Sample 1 | Inventive Sample 2 | Inventive Sample 3 |
|---|---|---|---|---|
| Etched with $H_2SO_4$ for 30 seconds | Yes | Yes | Yes | Yes |
| Exposed to HCl in ether at 25° C. | No | Yes | Yes | Yes |
| Halogenation of the Samples | No | Yes | Yes | Yes |
| Exposure to Solution of $C_8H_{17}MgCl$ | No | Yes | No | No |
| Exposure to Solution of $C_{14}H_{29}MgCl$ | No | No | Yes | No |
| Exposure to Solution of $C_{18}H_{37}MgCl$ | No | No | No | Yes |
| Initial Wetting Contact Angle (°) | 45° ± 4° | 85° ± 5° | 99° ± 4° | 107° ± 11° |

Figure 13:
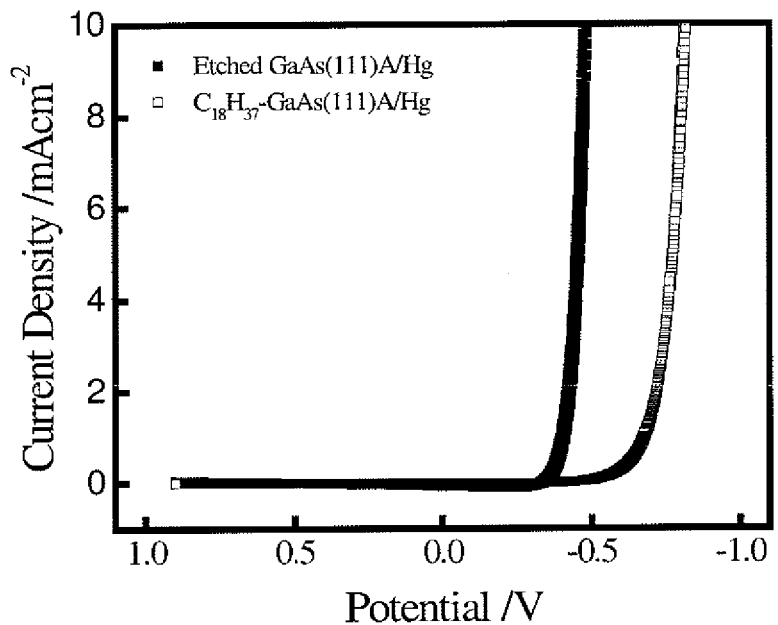
FIG. 13 is a graph illustrating current density as a function of potential for contacts between Hg and (1) the surface of GaAs(111)A after etching and (2) the surface of GaAs(111)A after etching, halogenation of gallium atoms, and reaction of halogenated gallium atoms with $C_{18}H_{37}MgCl$ to functionalize the surface.
Figure 14:
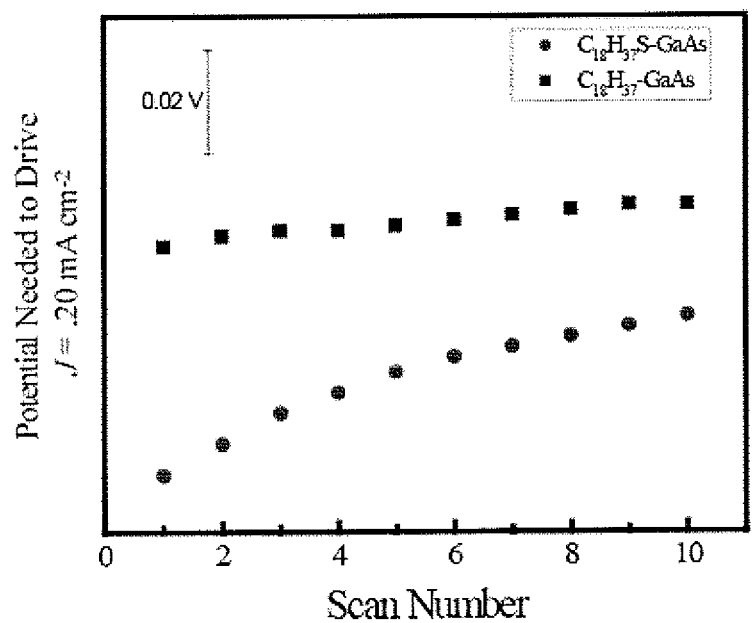
FIG. 14 is a graph illustrating electrical stability of surfaces to passage of current for (1) the surface of GaAs(111)A after thiolation with —$SC_{18}H_{37}$ and (2) the surface of GaAs(111)A after functionalization with $C_{18}H_{37}$.

Evaluation of Current-Voltage Responses (J-V) of n-GaAs (111)A/Hg Contacts:

The control samples and the functionalized wafers are also connected to Hg contacts and evaluated to determine a current-voltage response. As shown in FIG. 13, more negative potential is required to drive current through the functionalized surfaces indicating a chemically defined dielectric has been systematically introduced to the semiconductor.

Evaluation of Electrical Stability:

Additional samples of wafers are functionalized, but not according to the instant invention. More specifically, these additional samples are thiolated such that a sulfur atom is directly bonded to the gallium atom of GaAs. Even more specifically, the surfaces of these samples are functionalized to include $C_{18}H_{37}S$—GaAs. These samples are then evaluated to determine electrical stability as compared to functionalized ($C_{18}H_{37}$—GaAs) wafers of this invention. The electrical stability is determined through repetitive current-voltage scans. The results of this evaluation are set forth in FIG. 14 and show that the slow for the functionalized wafers of this invention is about $8.7 \times 10^{-4}$V while the slope for the thiolated wafers is about $3.3 \times 10^{-3}$V. This suggests that the functionalized surfaces of the wafers of this invention are more stable to passage of current than the comparative samples.

Evaluation of Resistance to Surface Oxidation:

Samples of the wafers of this invention (GaP(111)A and GaAs(111)A, each functionalized with $C_{18}H_{37}$) are evaluated to determine their resistance to oxidation. Comparative samples (GaP(111)A and GaAs(111)A, each etched but not functionalized) are also evaluated to determine their resistance to oxidation. More specifically, each of the aforementioned samples are exposed to the heated solvent for approximately 90 minutes. Over this time period, the overlayer oxidation thickness (nm) is determined as a function of time. The results of these evaluations are set forth in FIG. 12. The results clearly demonstrate that the wafers of this invention are more resistant to surface oxidation.

Third Series of Semiconductors:
Evaluation of Halogenation:

GaN(0001) semiconductor wafers are contacted with KOH for 1 minute at 70° C. to etch their surfaces. Subsequently, some of the wafers are submerged for 50 minutes in chlorobenzene saturated with $PCl_5$ for 50 minutes at 90° C., and then rinsed with neat chlorobenzene. The samples that are only etched serve as control samples. The wafers are then evaluated using $C_{1s}$ XP spectroscopy. The results of this spectroscopy are set forth in FIG. 15 and illustrate that GaN(0001) wafers are chlorinated.

Evaluation of the Presence of Ga—C Bonding Using $C_{1s}$ XP Spectroscopy:

Additional samples of wafers are also etched and halogenated as described above. A portion of these samples is then immersed in a solution of $FC_5H_4MgBr$ at 165° C. for 3 hours to functionalize the surfaces. After 3 hours, the wafers are rinsed with THF and methanol (JT Baker). These wafers are representative of the semiconductors instant invention. Another portion of these samples is not immersed in the solution and represent control samples.

The control samples and the wafers that are representative of the semiconductors of this invention are then evaluated using XP spectroscopy. The results of these evaluations are set forth in FIG. 16. These Figures show peaks corresponding to F and C, thereby indicating that bonding between then carbon atom of the $FC_5H_4$ and the gallium is successful.

Summary of the Examples and Results:

The aforementioned examples and results demonstrate that surfaces of semiconductors that include Group III element atoms can be effectively functionalized using a variety of methods and Grignard reagents. Moreover, once functionalized, the surfaces effectively resist oxidation. The results also suggest that longer alkyl chains provide increased resistance to oxidation. The data also suggests that for GaAs, organic groups that are introduced via Ga—C bonding are more stable towards the passage of current than analogous thiol products. Further, the aforementioned examples and results demonstrate that surfaces can be chemically tailored using chemistry that does not involve attachment at, or through, surface oxides.

It is to be understood that any of the numerical values associated with this invention, e.g. molecular weight ranges, ratios, etc., are not particularly limiting and may vary, so long as they vary in a way consistent with the scope of this invention. For example, any of the aforementioned numerical values may be further defined as any value or range of values, both whole and fractional, within those ranges and values described above and/or may vary from the values and/or range of values described above by ±5%, ±10%, ±15%, ±20%, ±25%, ±30%, etc.

It is also to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is further to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:

1. A semiconductor that has a functionalized surface that is resistant to oxidation, said functionalized surface comprising a plurality of atoms of a Group III element bonded to organic groups with said functionalized surface formed by reacting said plurality of atoms of said Group III element with a halogenating agent to bond a halogen atom to said plurality of atoms of said Group III element to form halogenated Group III atoms and reacting said halogenated Group III atoms with a Grignard reagent to bond said organic groups to said plurality of atoms of said Group III element, wherein said functionalized surface has less than or equal to about 1 atom of said Group III element bonded to an oxygen atom per every 1,000 atoms of said Group III element bonded to said organic groups, as determined using X-ray photoelectron spectroscopy.

2. A semiconductor as set forth in claim 1 wherein at least some of said plurality of atoms of said Group III element are covalently bonded to a Group V element.

3. A semiconductor as set forth in claim 2 wherein said Group V element is selected from the group consisting of nitrogen, phosphorous, and arsenic.

4. A semiconductor as set forth in claim 1 wherein said Group III element is further defined as gallium.

5. A semiconductor as set forth in claim 1 wherein said Group III element is further defined as indium.

6. A semiconductor as set forth in claim 1 wherein said Group III element is further defined as aluminum.

7. A semiconductor as set forth in claim 1 wherein at least one organic group is a substituted or unsubstituted alkyl or aryl group having from 1 to 50 carbon atoms.

8. A semiconductor as set forth in claim 1 wherein at least one organic group is a substituted or unsubstituted alkyl or aryl group having from 3 to 18 carbon atoms.

9. A semiconductor as set forth in claim 1 wherein at least one organic group is a substituted or unsubstituted alkyl or aryl group having from 16 to 18 carbon atoms.

10. A semiconductor as set forth in claim 2 wherein said Group III element is further defined as gallium, said Group V metal is further defined as phosphorous, at least a portion of said surface is further defined as a 111(A) crystalline plane, and at least one organic group is an unsubstituted alkyl group having from 16 to 18 carbon atoms.

11. A method of functionalizing a surface of a semiconductor to resist oxidation, wherein the surface comprises a plurality of atoms of a Group III element bonded to organic groups after functionalization of the surface, said method comprising the steps of:
   A. halogenating at least one of the plurality of atoms of the Group III element to form halogenated Group III element atoms;
   B. reacting at least one of the halogenated atoms of the Group III element with a Grignard reagent to form a bond between the at least one atoms of the Group III element and the organic groups and functionalize the surface of the semiconductor to resist oxidation.

12. A method as set forth in claim 11 further comprising the step of etching the surface with sulfuric acid.

13. A method as set forth in claim 12 wherein at least some of the plurality of atoms of the Group III element are covalently bonded to phosphorous and said step of halogenating is further defined as reacting at least one of the plurality of atoms of the Group III element with $PCl_5$.

14. A method as set forth in claim 12 wherein at least some of the plurality of atoms of the Group III element are covalently bonded to arsenic and said step of halogenating is further defined as reacting at least one of the plurality of atoms of the Group III element with HCl in ether.

15. A method as set forth in claim 11 further comprising the step of etching the surface with an alkaline metal hydroxide.

16. A method as set forth in claim 15 wherein at least some of the plurality of atoms of the Group III element are covalently bonded to nitrogen and said step of halogenating is further defined as reacting at least one of the plurality of atoms of the Group III element with $PCl_5$.

17. A method as set forth in claim 11 wherein at least some of the plurality of atoms of the Group III element are covalently bonded to nitrogen, phosphorous, or arsenic.

18. A method as set forth in claim 11 wherein the Grignard reagent has the chemical formula R-M-X wherein R is a substituted or unsubstituted alkyl or aryl group having from 1 to 50 carbon atoms, M is an alkaline or alkaline earth metal, and X is a halide.

19. A method as set forth in claim 18 wherein R is an alkyl group having from 3 to 18 carbon atoms.

20. A method as set forth in claim 18 wherein R is an alkyl group having from 16 to 18 carbon atoms.

21. An article comprising a semiconductor as set forth in claim 1.

22. An article set forth in claim 21 that is further defined as a solar-powered water electrolysis device.

* * * * *